(12) United States Patent
Behl

(10) Patent No.: US 6,840,801 B1
(45) Date of Patent: Jan. 11, 2005

(54) DOCKING APPARATUS FOR PC CARD DEVICES

(75) Inventor: Sunny Behl, San Jose, CA (US)

(73) Assignee: Steinbeck Cannery, LLC, Los Altos, CA (US)

(*) Notice: Subject to any disclaimer, the term of this patent is extended or adjusted under 35 U.S.C. 154(b) by 0 days.

(21) Appl. No.: 09/182,842

(22) Filed: Oct. 29, 1998

(51) Int. Cl.⁷ .................................................. G06F 1/16
(52) U.S. Cl. ................................ 439/541.5; 439/928.1; 439/945
(58) Field of Search ............................ 439/76.1, 374, 439/377, 928.1, 945, 541.5; 361/695, 684, 685, 686

(56) References Cited

U.S. PATENT DOCUMENTS

| | | | | | |
|---|---|---|---|---|---|
| 2,186,813 | A | * | 1/1940 | Adam et al. ................ | 439/484 |
| 4,941,841 | A | * | 7/1990 | Darden et al. .............. | 439/374 |
| 5,079,438 | A | * | 1/1992 | Heung ........................ | 361/695 |
| 5,171,183 | A | * | 12/1992 | Pollard et al. .............. | 361/685 |
| 5,184,282 | A | * | 2/1993 | Kaneda et al. | |
| 5,324,204 | A | * | 6/1994 | Lwee ......................... | 439/64 |
| 5,400,216 | A | * | 3/1995 | Tsai ........................... | 361/684 |
| 5,408,386 | A | * | 4/1995 | Ringer ....................... | 361/685 |
| 5,457,601 | A | * | 10/1995 | Georgopulos et al. ...... | 361/686 |
| 5,519,571 | A | * | 5/1996 | Shieh ......................... | 361/685 |
| 5,583,745 | A | * | 12/1996 | Uwabo et al. ............. | 361/685 |
| 5,801,922 | A | * | 9/1998 | Shen et al. ................. | 361/686 |
| 5,808,867 | A | | 9/1998 | Wang ......................... | 361/695 |
| 5,867,417 | A | * | 2/1999 | Wallace | |
| 5,877,488 | A | * | 3/1999 | Klatt et al. ................. | 235/486 |
| 5,898,568 | A | * | 4/1999 | Cheng ........................ | 361/695 |
| 5,978,219 | A | | 11/1999 | Lin ............................ | 361/697 |
| 5,980,276 | A | | 11/1999 | Arita et al. ................. | 439/131 |
| 5,982,624 | A | * | 11/1999 | Onoda et al. ............... | 361/737 |
| 6,061,236 | A | * | 5/2000 | Klein ......................... | 361/695 |
| 6,137,710 | A | * | 10/2000 | Iwasaki et al. ............. | 365/52 |
| 6,381,662 | B1 | * | 4/2002 | Harari et al. .............. | 710/102 |

FOREIGN PATENT DOCUMENTS

| | | |
|---|---|---|
| JP | 08339427 A | 12/1996 |
| JP | 8-339427 | * 12/1996 |

OTHER PUBLICATIONS

HTTP://CARRY.COM.TW/PRODUCTS/PICA.HTM Oct. 27, 1998.

* cited by examiner

*Primary Examiner*—Neil Abrams
(74) *Attorney, Agent, or Firm*—Townsend and Townsend & Crew, LLP

(57) ABSTRACT

A carrier and docking assembly in combination for removeably interconnecting a PC card device with a computer. The docking assembly is configured in size to be fixed in a memory storage device bay of a computer housing, or a memory storage device housing. The docking assembly includes a plug for the carrier, a power connector and an interface connector. The interface connector is adapted for connection with an IDE ribbon cable. The carrier includes a PC card device for receiving PC cards and a plug for interconnection with the docking assembly. The carrier plug removeably couples with the plug of the docking assembly. The card device (62) includes slot (68) and slot (70) for receiving plural PC type cards, the slots (68) and (70) are offset to receive cards of different sizes.

15 Claims, 3 Drawing Sheets

FIG.—1
(PRIOR ART)

DOCKING APPARATUS FOR PC CARD DEVICES

FIELD OF THE INVENTION

The present invention pertains to memory storage devices and more particularly to mechanisms for docking PC card-type devices in memory storage device bays.

BACKGROUND OF THE INVENTION

PC cards are widely used in laptop computers for interconnecting devices including modems, network cards, flash memory, and miniature hard disk drives to the laptop computer. One major benefit of the PC cards is that they are very small. Some are sized smaller than credit-cards.

PC cards are now being used in cameras and other devices for storing data, sound and images. Some digital cameras have PC card technology, including flash memory, to record digital photographs. PC cards are removable from the camera to transport the images to a laptop or other computer. Accordingly, the recorded image can be viewed and/or printed. Most laptop computers have PC card slots built in.

Although the demand for PC card based devices such as digital cameras has increased in recent years, many desk top type personal computers are not specifically adapted to accommodate PC cards. Various externally connectable PC card devices have been developed. A typical externally connectable PC card device plugs into the parallel, or serial port of a standard personal computer. Power is supplied to the PC card device from an external plug, or from a keyboard connection, for example.

Many computer users have speakers, printers, scanners, lamps and other power drawing devices plugged in near the computer system creating a tangled mess of wire. Additional wires for a PC card device are undesirable. What is desired is a PC card device that does not require additional wires and which conveniently connects to a personal computer.

FIG. 1 shows a docking assembly 10 and carrier 12. The docking assembly 10 is fixed in a hard drive bay of a typical personal computer 14. The personal computer 14 has an internal power supply 16 and an IDE ribbon cable 18. The docking assembly 10 couples with the power supply 16 and the IDE ribbon cable 18 of the computer 14. The docking assembly 10 includes a plug 20 for receiving the carrier 12.

The carrier 12 includes a base 22 and a cover 24 for housing a hard drive 16. The carrier 12 slides into the docking assembly 10 to couple the hard drive 26 with the power supply 16 and the IDE ribbon cable 18. Computer users rely on carriers 12 to selectively interconnect multiple disk drives to the personal computer 14 having a docking assembly 10.

SUMMARY OF THE INVENTION

The present invention includes a carrier with a card device. The carrier is connectable with a memory storage device rack having rails. The carrier has rails that slide with respect to the rails of the rack to enable the carrier to slide into the rack and to removably mount the carrier in the rack. A card device mounts in the carrier and is adapted with plural card slots for receiving plural cards and the card slots are are offset for receiving different sized cards.

Preferably the carrier is integrated with a system capable of docking memory storage devices or plural card devices to a personal computer includes a rack and a carrier. The rack is fixed in a personal computer and has rails for receiving a device carrier. The carrier is connectable with the rack, the carrier has rails that slide with respect to the rails of the rack to enable the carrier to slide into the rack and to removably mount the carrier in the rack. A card device mounts in the carrier and has plural card slots that are offset for receiving plural cards of different sizes. The carrier having a handle for removing the carrier from the rack so that removal of the carrier enables replacement of the carrier with another carrier holding a hard disk drive, a card device, or other device.

DETAILED DESCRIPTION OF THE INVENTION

Figure 1:
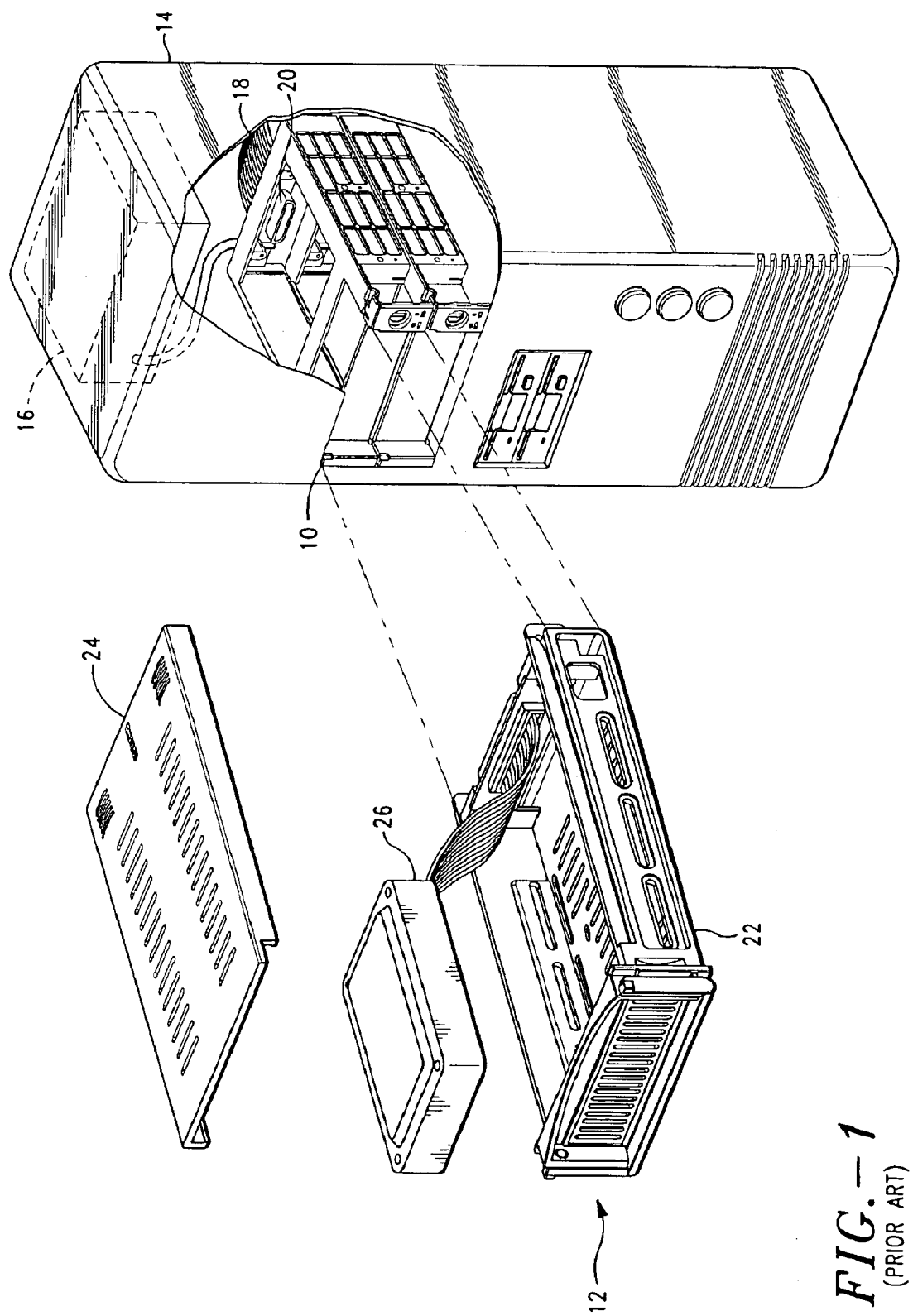
FIG. 1 is a perspective view of a known hard disk drive docking assembly and carrier.
Figure 2:
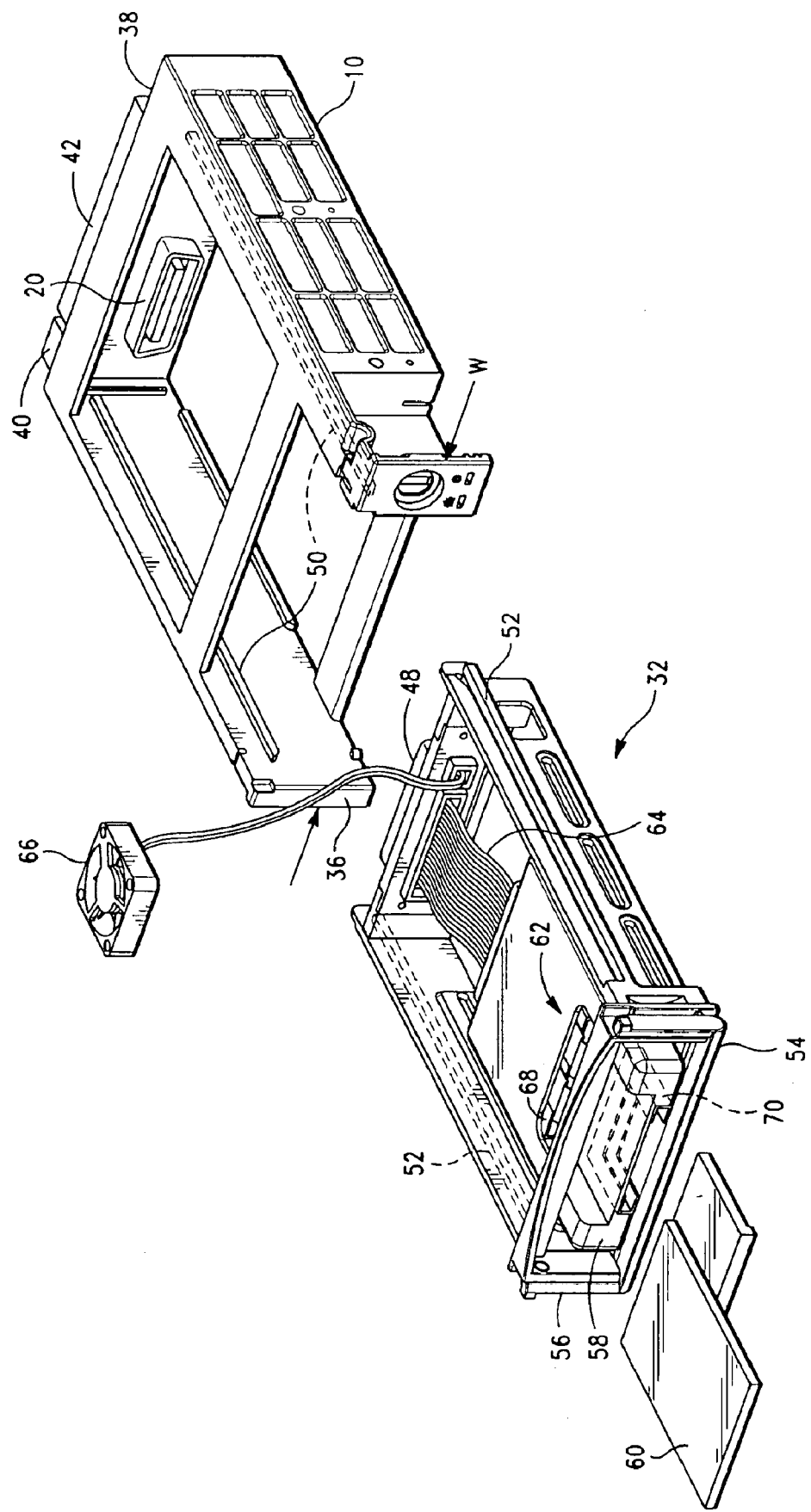
FIG. 2 is an exploded perspective view of a PC Card carrier in accordance with the present invention.

FIG. 2 shows a docking assembly 10 and a carrier 32. The docking assembly 10 is adapted for coupling with an IDE ribbon cable. The docking assembly 10 includes a pair of lateral sides 34. The sides 34 fix the docking assembly 10 within a memory storage device bay of a personal computer, for example, to enable the docking assembly to couple with the IDE ribbon cable in the personal computer. It can be appreciated, however, that the present invention can also be used in a memory storage device housing, or other housing having a memory storage device bay. Further, although an IDE ribbon cable interface is shown, the docking assembly 10 and carrier 32 combination can be configured for use with a SCSI or other desired interface. As various interface standards evolve, the docking assembly 10 and carrier 32 combination can be adapted to fit each of those standards without departing from the scope and spirit of the invention.

The docking assembly 10 has a front 36 and a rear 38. The rear 38 includes a power connector 40 and a ribbon cable connector 42. The front 36 includes a lock 44 for holding the carrier 32 within the docking assembly 10.

The docking assembly 10 includes a width "w". The width "w" is 5¼ inches to fit in a 5¼ inch memory storage bay. In an alternate embodiment of the invention, the width "w" 3½ inches to fit in a 3½ inch memory storage bay. It can be appreciated that although this invention is configured in size to fit in standard memory storage bay sizes, the invention can be adapted as the memory storage bay size standards evolve.

The docking assembly 10 includes a plug 46 for removeably coupling the carrier 32 to the docking assembly 10. The carrier 32 has a plug 48 for mating with the plug 20 of the docking assembly 10. The docking assembly 10 has rails 50 defined on each of the lateral sides 34 for guiding and aligning the carrier 32. The carrier 32 has rails 52 to mate with the rails 50 of the docking assembly 10.

The carrier 32 has a front 52 and a folding handle 54. The folding handle 54 mounts on the front 52. The front 52 of the carrier 32 defines an opening for receiving a PC card. Although a folding handle 54 is shown, any handle type to enable removal of the carrier 32 from the docking assembly 10 will do.

A PC card device 62 mounts in the carrier 32 to receive PC cards. The PC card device 62 is adapted for PCMCIA standard type I, II, or III type flash memory cards. According to an aspect of the invention, the PC card device 62 is adapted for Compact Flash, ATA Flash, or PCMCIA hard disks. The PC card device 62 can be adapted to receive other cards of like, or smaller, sizes. The PC card device 62 is capable of reading and writing data to the PC cards. The PC card device 62 is adapted with plural card slots for receiving plural cards of different sizes.

The PC card device 62 includes adapter circuitry 64. The circuitry 64 couples the PC card device 62 with the plug 48 so that the PC card device 62 can communicate with, for example, either an IDE or SCSI interface.

Figure 3:
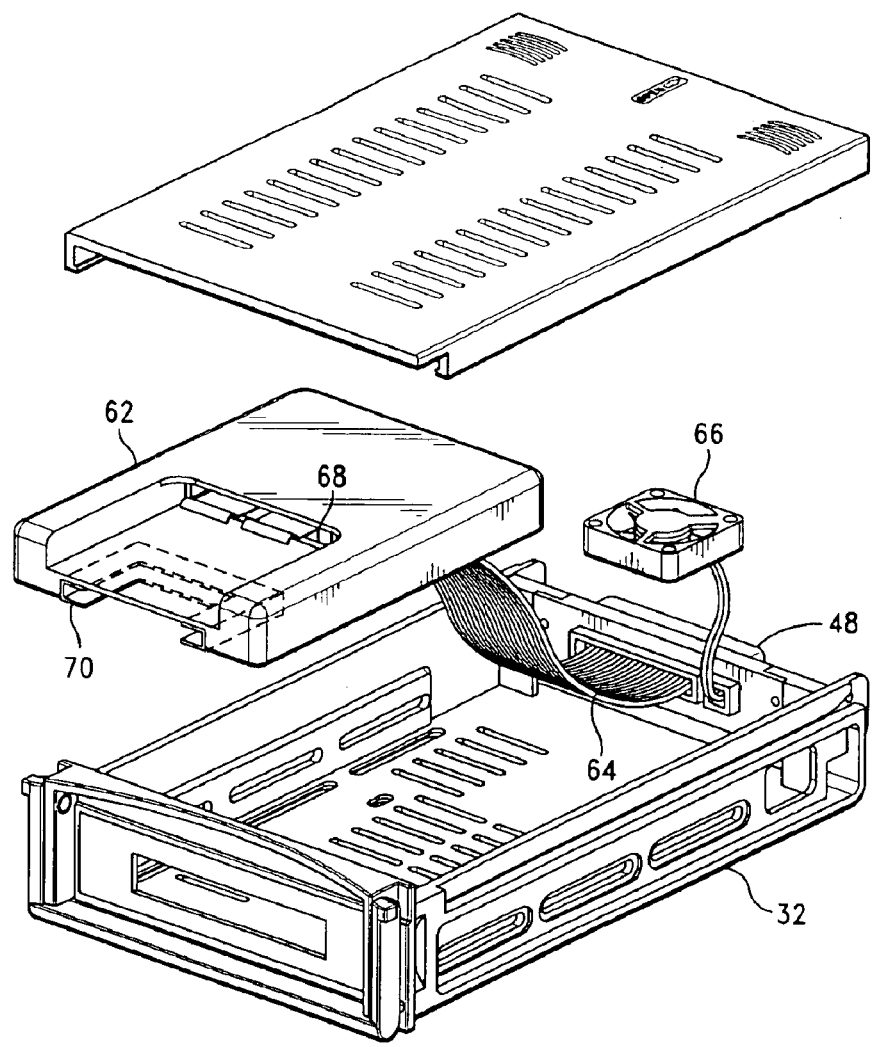
FIG. 3 is an exploded perspective view of a carrier including a fan.

FIG. 3 includes the PC card device 62 and a fan 66 mounted in the carrier 32. The fan 66 couples with the plug 48 to draw power. It can be appreciated that the carrier 32 enables interconnection of any of a variety of devices, including PC card devices, hard disk drives, cooling fans, etc. to a docking assembly in a memory storage device bay.

Figure 4:
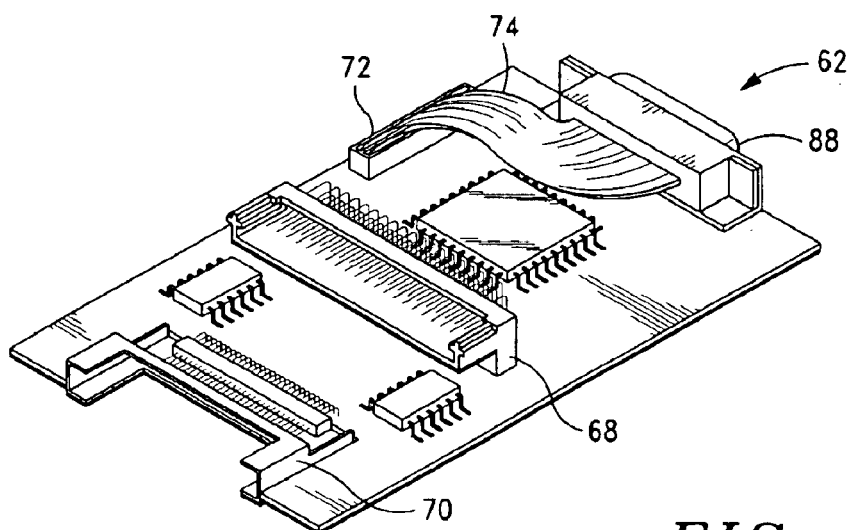
FIG. 4 is a perspective view of an embodiment of a circuit board design for the PC Card carrier.

FIG. 4 shows a portion of the PC card device 62 including adapter circuitry 64. The circuitry includes a PCMCIA type III slot 68, a COMPACT FLASH slot 70, an IDE interface pin connector 72 and the plug 48. A ribbon cable 74 couples the pin connector 72 with the plug 48.

The circuitry 64 mounts in the carrier 32 (FIG. 3). Both slots 68 and 70 receive PC cards. The circuitry 64 adapts the PC card slots 68 and 70 to communicate with the IDE interface pin connector 72. Accordingly the circuitry 64 enables PC cards to communicate with a docking assembly via the plug 48. The circuitry 64 is configured so that the PCMCIA slot 68 and the COMPACT FLASH slot 70 are offset so that both slots 68 and 70 can be used simultaneously.

This detailed description is presented by way of example only. Various modifications, additions and variations of the disclosed apparatus are possible. Accordingly, the invention is to be limited only by the claims below.

I claim:

1. A carrier and docking assembly for interconnecting a PC card device to a memory storage device bay of a personal computer, comprising:
    a docking assembly having a pair of lateral sides for fixing the docking assembly in a memory storage bay, the lateral sides having rails;
    a carrier slidably and removably mountable in the docking assembly, the carrier having rails that mate with the rails of the docking assembly, the carrier having a front and a rear, the rear has a plug for removably interconnecting the carrier with the docking assembly;
    a fan mounted in the carrier for cooling the carrier; and
    a PC card device having adapter circuitry mounted on the carrier and electrically connected with the plug;
    wherein plural PC cards can engage with the PC card device through plural PC card slots at the front of the carrier.

2. A carrier as set forth in claim 1, wherein the PC card device has a PCMCIA type III slot and a COMPACT FLASH slot for reading and writing to PC cards of various configurations.

3. A carrier as set forth in claim 2, wherein the adapter circuitry includes an IDE interface pin connector and the IDE interface pin connector couples with the plug.

4. A carrier as set forth in claim 2, wherein the PC card device includes a ribbon cable extending from the IDE interface pin connector to the plug.

5. A carrier as set forth in claim 1, wherein the carrier includes a folding handle mounted on the front.

6. A carrier and docking assembly as set forth in claim 1, wherein the docking assembly includes a front, the front has a lock for holding the carrier within the docking assembly.

7. A carrier and docking assembly in combination for removeably interconnecting a PC card device with a computer, comprising:
    a docking assembly having a pair of lateral sides for fixing the docking assembly in a memory storage bay, the lateral sides having rails;
    a carrier slideably mountable into the docking assembly, the carrier has rails that mate with the rails of the docking assembly;
    a fan mounted in the carrier for cooling the carrier;
    a PC card device mounted in the carrier and being electrically connected with the docking assembly via the carrier; and
    the PC card device includes plural offset slots for receiving plural PC cards.

8. A carrier and docking assembly as set forth in claim 7, wherein the docking assembly has width of 5¼ inches for inserting the carrier in a 5¼ inch memory storage bay.

9. A carrier and docking assembly as set forth in claim 7, wherein the docking assembly has a width of 3½ inches for inserting the carrier in a 3½ inch memory storage bay.

10. A carrier and docking assembly as set forth in claim 7, wherein the carrier and docking assembly have rails for aligning the carrier with a docking assembly.

11. A carrier and docking assembly as set forth in claim 7, wherein the carrier has a handle for removing the carrier from the docking assembly and for carrying the carrier.

12. A carrier and docking assembly in combination for removeably interconnecting a fan with a computer, comprising:
    a docking assembly having a pair of lateral sides for fixing the docking assembly in a memory storage bay, the lateral sides having rails;
    the docking assembly includes a power connector;
    a carrier slidably mountable in the docking assembly, the carrier has plural offset slots for receiving plural PC cards and rails that mate with the rails of the docking assembly; and
    a fan mounted in the carrier for cooling the carrier, the fan electrically connects with the docking assembly when the carrier slides into the docking assembly to enable the fan to cool the computer.

13. A carrier for interconnecting a PC card device to a personal computer, comprising:
    a carrier connectable with a memory storage device rack which is mounted in a memory storage bay of a personal computer and which includes rails, the carrier having rails that slide with respect to the rails of the rack to enable the carrier to slide into the rack and to removably mount the carrier in the rack; and
    a card device mounted in the carrier and being adapted with plural card slots for receiving plural cards.

14. A carrier as set forth in claim 13, wherein the carrier has a handle for removing the carrier from the rack.

15. A system comprising:
    a personal computer,
    a rack fixed in a memory storage bay of the personal computer, the rack having rails for receiving a carrier;
    a carrier being connectable with the rack, the carrier having rails that slide with respect to the rails of the rack to enable the carrier to slide into the rack and to removably mount in the rack, a card device mounted in the carrier having plural offset slots for receiving plural cards of different sizes; and the carrier having a handle for removing the carrier from the rack so that removal of the carrier enables replacement of the carrier with another carrier holding a hard disk drive, a card device, or other device.

* * * * *